(12) United States Patent
Yu et al.

(10) Patent No.: US 9,888,616 B2
(45) Date of Patent: Feb. 6, 2018

(54) CHASSIS STRUCTURE FOR INDUSTRIAL UNINTERRUPTIBLE POWER SUPPLY SYSTEM

(71) Applicant: VOLTRONIC POWER TECHNOLOGY CORP., Taipei (TW)

(72) Inventors: Tung-Chen Yu, New Taipei (TW); Xiao-Bo Wan, Shenzhen (CN); Juor-Ming Hsieh, Taipei (TW)

(73) Assignee: VOLTRONIC POWER TECHNOLOGY CORP., Taipei (TW)

(*) Notice: Subject to any disclaimer, the term of this patent is extended or adjusted under 35 U.S.C. 154(b) by 0 days.

(21) Appl. No.: 15/176,335

(22) Filed: Jun. 8, 2016

(65) Prior Publication Data
US 2017/0172015 A1   Jun. 15, 2017

(30) Foreign Application Priority Data

Dec. 10, 2015  (CN) .................. 2015 2 1030347 U

(51) Int. Cl.
| H05K 7/20 | (2006.01) |
| H05K 7/14 | (2006.01) |
| H05K 5/02 | (2006.01) |
| H02J 9/06 | (2006.01) |

(52) U.S. Cl.
CPC ............ *H05K 7/20909* (2013.01); *H02J 9/06* (2013.01); *H05K 5/0217* (2013.01); *H05K 7/14* (2013.01); *H05K 7/20154* (2013.01)

(58) Field of Classification Search
CPC .. H05K 7/20909; H05K 7/14; H05K 7/20154; H05K 7/20136–7/20145; H05K 7/20554–7/20581; H05K 7/20718–7/20745; H02J 9/06

USPC .......................................................... 454/184
See application file for complete search history.

(56) References Cited

U.S. PATENT DOCUMENTS

| 6,388,879 | B1* | 5/2002 | Otaguro | G02B 6/43 361/695 |
| 9,263,869 | B2* | 2/2016 | Prince | H02B 1/52 |
| 2003/0223196 | A1* | 12/2003 | Smith | G06F 1/181 361/679.48 |
| 2004/0130868 | A1* | 7/2004 | Schwartz | G06F 1/20 361/679.48 |
| 2004/0252456 | A1* | 12/2004 | Larson | G06F 1/20 361/694 |
| 2007/0279865 | A1* | 12/2007 | Yoshida | H02M 7/003 361/697 |

(Continued)

*Primary Examiner* — David M Sinclair
*Assistant Examiner* — Robert Brown
(74) *Attorney, Agent, or Firm* — Li & Cai Intellectual Property (USA) Office

(57) ABSTRACT

The instant disclosure relates to a chassis structure for industrial uninterruptible power supply system including: a chassis having a frame and a front side panel, left side panel, right side panel, rear side panel and top panel installed on the frame; the chassis has a plurality of spacer on the bottom thereof for lifting the chassis from the ground for a distance to forming a gas-intake space; a plurality of protective plates disposed around the gas-intake space, each protective plate has a plurality of gas-intake hole; a bottom plate structure disposed between the bottom of the chassis and the gas-intake space and has at least a gas-intake gap; at least a venting hole disposed on the top panel of the chassis, each venting hole has at least an exhaust fan for outputting a gas from the chassis.

17 Claims, 12 Drawing Sheets

(56) References Cited

U.S. PATENT DOCUMENTS

| | | | | |
|---|---|---|---|---|
| 2008/0074849 | A1* | 3/2008 | Adducci | E05C 9/043 |
| | | | | 361/724 |
| 2009/0135559 | A1* | 5/2009 | Adducci | H05K 7/186 |
| | | | | 361/692 |
| 2010/0144265 | A1* | 6/2010 | Bednarcik | H05K 7/20745 |
| | | | | 454/184 |
| 2012/0327601 | A1* | 12/2012 | Shintani | H05K 7/20909 |
| | | | | 361/697 |
| 2013/0120931 | A1* | 5/2013 | Sankar | H05K 7/20745 |
| | | | | 361/679.48 |
| 2014/0024305 | A1* | 1/2014 | Fu | H05K 7/1495 |
| | | | | 454/184 |
| 2016/0360642 | A1* | 12/2016 | Talka | H05K 7/20145 |
| 2017/0150654 | A1* | 5/2017 | Kubo | H02M 7/003 |

* cited by examiner

CHASSIS STRUCTURE FOR INDUSTRIAL UNINTERRUPTIBLE POWER SUPPLY SYSTEM

BACKGROUND

1. Technical Field

The instant disclosure relates to a chassis structure for uninterruptible power supply system, in particular, to a chassis structure for large-scale industrial uninterruptible power supply system.

2. Description of Related Art

A large amount of computer and automatic equipment is employed in the information equipment room in the network or communication industries, the control center of the public traffic facilities such as the metro, high speed railway and highway, and the control center of the hospitals and productive factories. During the operation of this information and electronic equipment, stable and uninterruptible power supply is a basic requirement for running normally. However, the existing public power supply systems usually are affected by broken wires and short circuits in the wiring transmission-distribution, thereby inducing voltage reduction or power outage to the power users.

The existing uninterruptible power supply systems are widely used at the user end to assist the user to solve the problem of abnormality of power supply. The operation principle of the uninterruptible power supply system is to store the electric power in an accumulator battery, and the electric power is used for the load after the commercial power cuts off.

The complexity of the functions of the information and communication of the data centers and equipment rooms are increased and the data processed by this equipment is huge. Therefore, the required electric power and the stability of the power is increased. The industrial uninterruptible power supply system for these large-scale information equipment rooms must have high stability and reliability.

The design of the chassis and heat dissipation structure of the industrial uninterruptible power supply systems is important to operation stability. In general, the heat generation density of the inner circuit elements of the industrial uninterruptible power supply system is relatively high and hence, the heat dissipation property must be improved to avoid overheating. On the other hand, in order to avoid external contaminant from entering the housing and causing circuit element damage, the protective and isolation property of the chassis must be enhanced. For example, the protection level of the industrial uninterruptible power supply system used in certain special environment reaches level IP54 (i.e., has a high level of protection against particles, and a fair amount of protection against water).

The heat dissipation property and the ventilation of the chassis are in a positive correlation, and when the ventilation increased, the protection (enclosing property) of the chassis would decrease. Therefore, there is a dilemma in the design of the conventional uninterruptable power supply system.

In addition, the installing position of the inner circuit components in the chassis of the conventional uninterruptable power supply systems is not optimized and hence, when an error occurs, the malfunctioning components are usually disposed at the left and right side, or even at the rear side of the chassis. Therefore, when performing the service, there is a need to remove the side panel on the left and right side, even the side panel on the rear side of the chassis. Moreover, other information equipment or electronic equipment must not be arranged at the left, right and rear sides of the uninterruptable power supply system, thereby ensuring the service space for the uninterruptable power supply system.

Based on the above, the heat dissipation property of the chassis of the conventional industrial uninterruptable power supply system and the protection thereof is not good. Accordingly, there is a need for providing a design of the chassis of the conventional industrial uninterruptable power supply system to improve the heat dissipation and protection properties for overcoming the above problems.

SUMMARY

The main object of the instant disclosure is to provide a chassis structure for an industrial uninterruptible power supply system having improved heat dissipation performance, while ensuring the protection property of the chassis to prevent external contaminants from entering the chassis and causing short circuit or damage of the circuit components disposed in the chassis.

An exemplary embodiment of the present disclosure provides a chassis structure for an industrial uninterruptible power supply system comprising a chassis having a frame and a front side panel, a left side panel, a right side panel, a rear side panel and a top panel installed on the frame, the bottom of the frame has a plurality of spacer members disposed thereon, the plurality of spacer members lift the bottom of the frame from the ground for a distance and a gas-intake space is formed between the bottom of the frame and the ground. A bottom plate structure is disposed between the bottom of the frame and the gas-intake space, and the bottom plate structure has at least a gas-intake gap for enabling a gas inside the gas-intake space to enter an inner space of the frame through the gas-intake gap, and at least a venting hole disposed on the top panel of the frame and has at least an exhaust fan disposed therein, the exhaust fan discharges the gas from the frame through the venting hole.

In a preferable embodiment of the instant disclosure, a controller assembly is disposed at an upper portion in the chassis, and the controller assembly comprises a heat dissipation module and at least a power chip, and the power chip is disposed on the heat dissipation module.

In a preferable embodiment of the instant disclosure, the controller assembly further comprises a front stopper plate spaced from the heat dissipation module and disposed on a side of the controller assembly facing the front end of the chassis, a circuit substrate disposed on a side surface of the front stopper plate, an air extracting cap, the bottom of the air extracting cap is connected to the top end of the heat dissipation module and the top end of the extraction cap is connected with the venting hole, and a housing plate disposed between the bottom of the front stopper plate and the bottom of the heat dissipation module. The heat dissipation module, the front stopper plate and the top plate of the chassis form an isolation space, and the air extracting cap connects the venting hole and the top end of the heat dissipation module.

In a preferable embodiment of the instant disclosure, an inner space of the chassis is divided into an upper space and a lower space, the upper space has a central spacing plate parallel to the front side panel and dividing the upper space into a front space and a rear space, the venting hole of the frame comprises at least a front venting hole corresponding to the front space and at least a rear venting hole corresponding to the rear space, and the exhaust fan comprises at least a front exhaust fan disposed in the front venting hole, and at least a rear exhaust fan disposed in the rear venting hole.

In a preferable embodiment of the instant disclosure, a first heat dissipation channel is formed by a gas flow channel starting from the gas-intake space of the bottom of the chassis to the lower space, from the rear side of the lower space to the rear space and the rear venting hole, and a second heat dissipation channel is formed by a gas flow channel starting from the gas-intake space to the lower space, and from the lower space to the front space and the front venting hole.

In a preferable embodiment of the instant disclosure, the controller assembly is disposed at an upper portion of the front space, the heat dissipation module is directly adjacent to a side of the central spacing plate facing the front side panel, the top of the air extracting cap is connected to the bottom surface of the top panel of the chassis and is connected with the venting hole.

In a preferable embodiment of the instant disclosure, a transformer assembly is disposed in the first heat dissipation channel; the controller assembly is disposed at an upper end of the second heat dissipation channel and a distribution board assembly is disposed at a lower end of the second heat dissipation channel. A position between the controller assembly and the distribution board assembly in the second heat dissipation channel accommodates a capacitor assembly.

In a preferable embodiment of the instant disclosure, a plurality of protective plates is disposed around the gas-intake space, each protective plate has a plurality of gas-intake pores for allowing the air to flow outside the protective plates into the gas-intake space.

The advantage of the instant disclosure is that the instant disclosure can improve the operation stability, reliability and safety of the uninterruptable power supply system while ensuring the protective and heat dissipation performance thereof.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
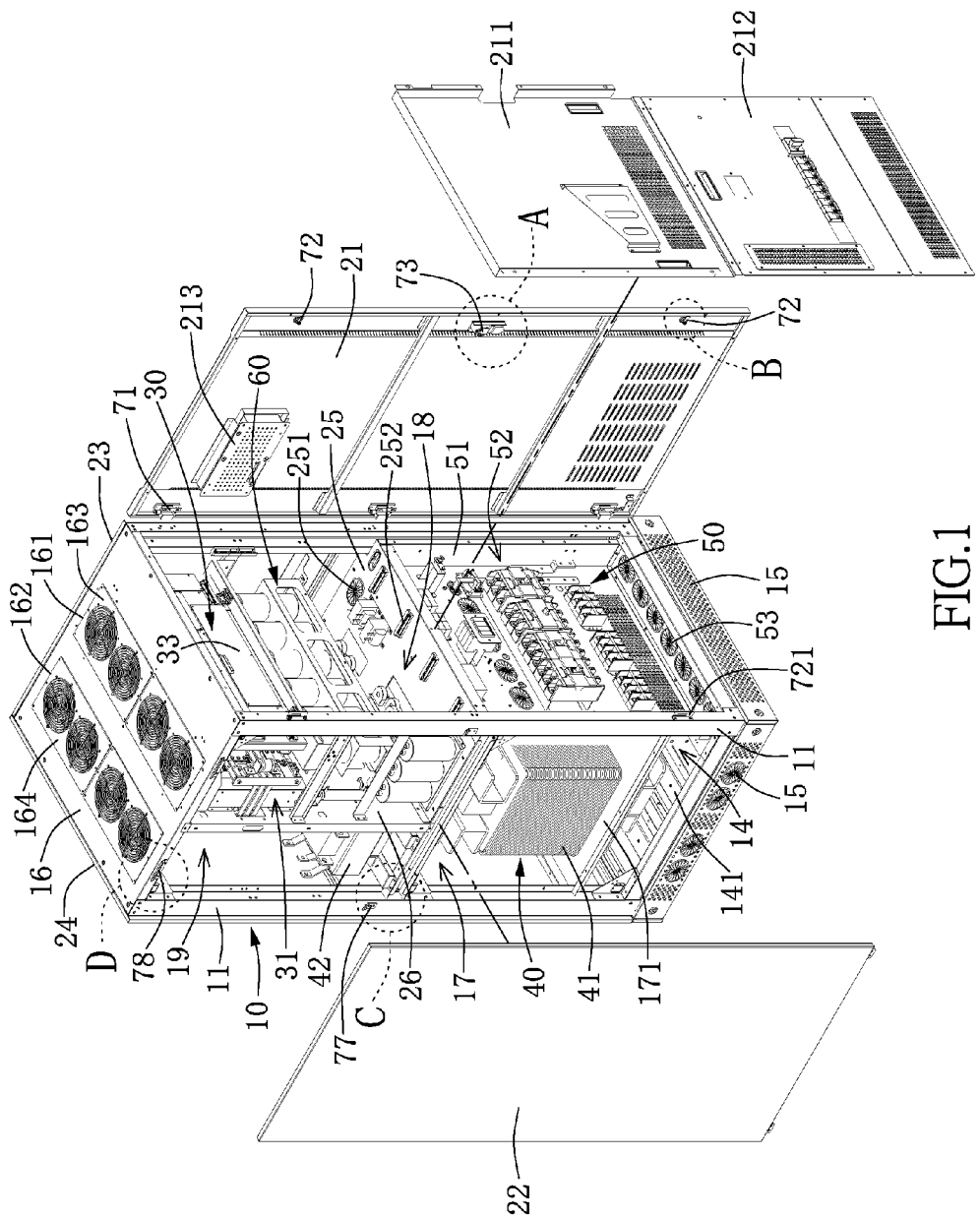
FIG. 1 is a three-dimensional exploded view of the chassis structure for industrial uninterruptable power supply system of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

As shown in FIG. 1 to FIG. 4, the chassis structure for an industrial uninterruptable power supply system mainly comprises a chassis 10, which is a vertical tower chassis. The chassis 10 has a frame 11 and a front side panel 21, a left side panel 22, a right side panel 23, a rear side panel 24 and a top panel 16 installed on the frame 11.

As shown in FIG. 1, the frame 11 is a square frame formed by a plurality of rods. The front side panel 21 is disposed at the front side surface of the frame 11 and has a display panel 213 disposed thereon for displaying the status for the user to operate the uninterruptible power supply system. The front side surface of the frame 11 may further comprise an upper cover panel 211 and a lower cover panel 212 for protecting the circuit components in the frame 11 from being exposed when the front side panel 21 is opened, thereby increasing the safety of the system.

Figure 2:
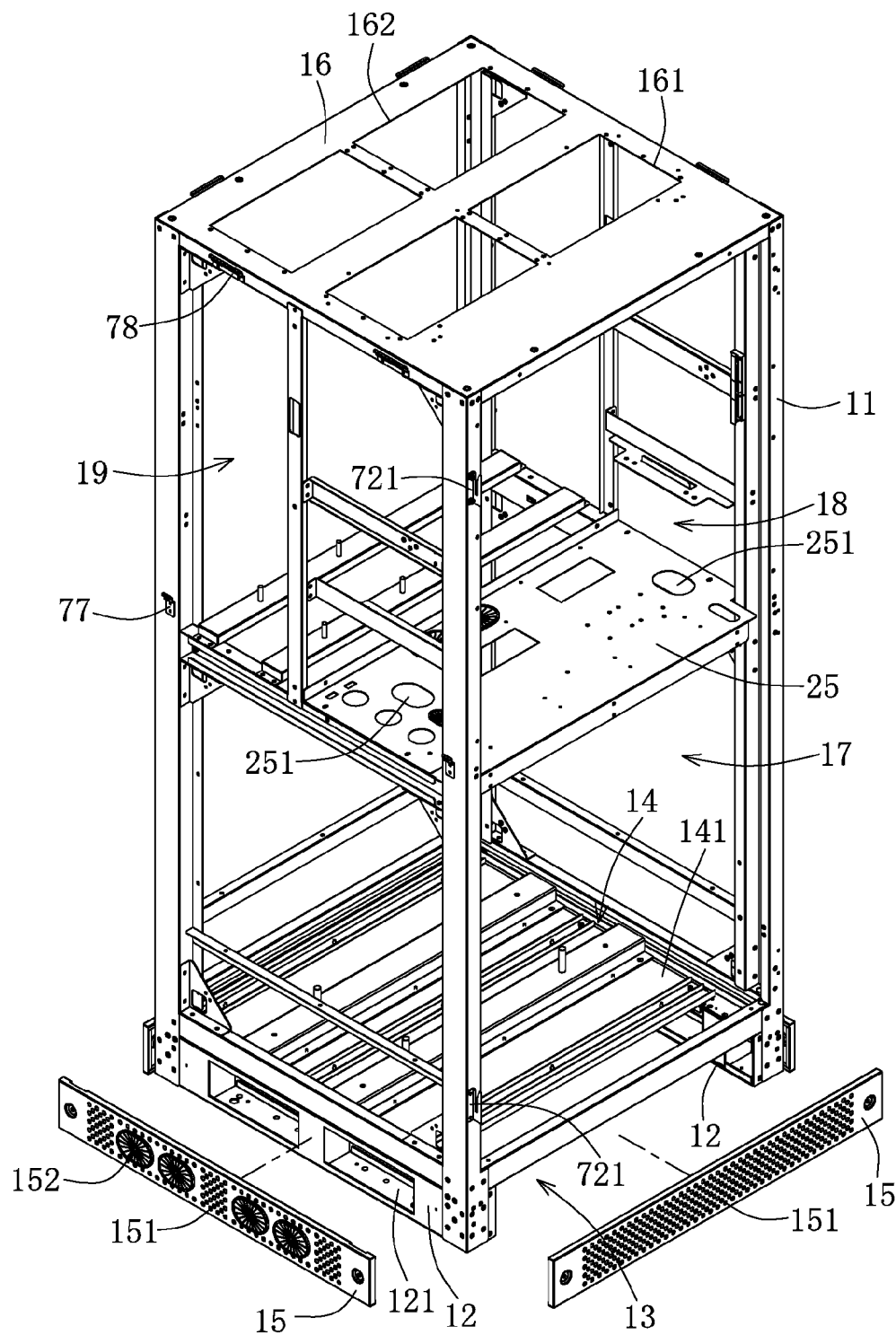
FIG. 2 is a three-dimensional partial exploded view of the frame and bottom gas-intake structure of the chassis used in the instant disclosure.

The left and right sides and the rear side of the frame 11 has the left side panel 22, the right side panel 23 and the rear side panel 24 disposed thereon respectively for forming a case with the front side panel 21. The top surface of the frame 11 has the top panel 16 disposed thereon, and the bottom of the frame 11 has a bottom plate structure 14 disposed thereon. As shown in FIG. 2, each of the two sides of the frame 11 has a spacer member 12 and when the frame 11 is placed on the ground, the two spacer members contact the ground for forming a gap between the bottom of the bottom plate structure 14 at the bottom of the frame 11 and the ground, thereby forming a gas-intake space 13. The two sides of the two spacer members 12 can further have a plurality of notch portions 121 for allowing the gas to flow from the side surface of the spacer members 12 into the gas-intake space 13.

As shown in FIG. 2, the bottom plate structure 14 has a plurality of venting plates 141, the venting plates 141 can be made from screen plates having a protection level of IP4 and hence, the heat dissipation gas flow passes through the venting plates 141 but the impurities and external contaminants are blocked by the venting plates 141. A plurality of protective plates 15 are surroundingly disposed at the bottom of the frame 11 around the gas-intake space 13 for shielding the gas-intake space 13, each protective plate 15 has a plurality of mesh-like gas-intake pores 151 and a plurality of gas-intake holes 152 having larger diameters and with filters allowing the gas to flow through the protective plates 15 into the gas-intake space 13.

As shown in FIG. 1 and FIG. 2, the top panel 16 has a plurality of venting holes disposed thereon, and the venting holes comprise at least a front venting hole 161 and at least a rear venting hole 162. The front venting hole 161 has a set of front exhaust fans 163 disposed therein and the rear venting hole 162 has a set of rear exhaust fan 164 disposed therein for forcing the flow of the gas inside the chassis 10 to discharge from the front venting hole 161 and the rear venting hole 162 to the outside of the chassis 10.

Figure 3:
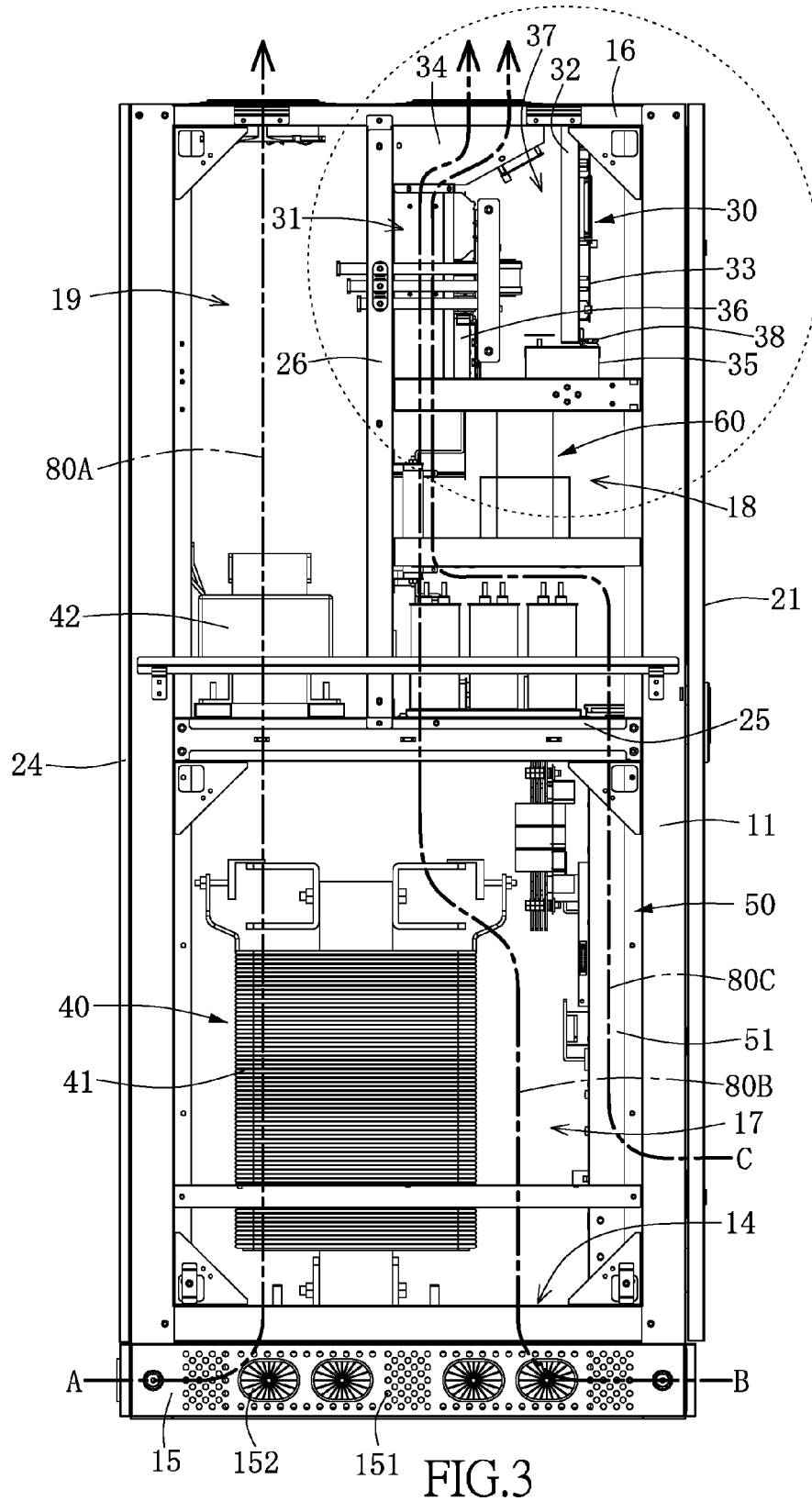
FIG. 3 is a side assembly view of the chassis structure for industrial uninterruptable power supply system of the instant disclosure after the side panels are removed.

As shown in FIG. 1, FIG. 2 and FIG. 3, the inner space of the chassis 10 of the instant disclosure is further divided into a lower space 17, and a front space 18 and a rear space 19 above the lower space 17. A central spacing plate 26 parallel to the front side panel 21 and the rear side panel 24 is disposed between the front space 18 and the rear space 19 for dividing the front space 18 and the rear space 19. The front venting hole 161 at the top panel 16 of the chassis 10 corresponds to the front space 18, and the spacer member 12 corresponds to the rear space 19. A horizontal spacer 25 is disposed under the central spacing plate 26, the horizontal spacer 25 is located at the junction of the lower end of the front space 18 and the lower space 17 and has a plurality of venting pores 251 for the gas flow to flow through. The horizontal spacer 25 has a plurality of wiring devices 252 disposed thereon for wiring the circuit components inside the uninterruptible power supply system.

By means of the central spacing plate 26, the gas flow direction in the chassis 10 is divided into two parts, the first part flows as shown by the arrow A in FIG. 3: the gas flow enters the gas-intake space 13 from the protective plate 15 at the bottom of the chassis 10 and passes through the bottom plate structure 14 and the lower space 17, then flows to the rear space 19 of the upper portion of the chassis along the rear side of the lower space 17 of the chassis 10, and discharges from the rear venting hole 162 at the top of the chassis 10. The above flow path is defined as the first heat dissipation channel 80A.

The other gas flow channel is shown as the arrow B in FIG. 3. The gas flows from the gas-intake space 13 to the front side of the lower space 17, then passes through the venting pore 251 of the horizontal spacer 25 and enters the front space 18, and discharges from the front venting hole 161. This part of the gas flow path is defined as the second heat dissipation channel 80B.

As shown in FIG. 1 and FIG. 3, there are less circuit elements arranged in the space of the first heat dissipation channel 80A inside the chassis 10 and the gas flow path is subjected to less obstacles, and hence, the heat dissipation gas flow speed is higher. The gas flow path in the second heat dissipation channel 80B is more tortuous and the heat dissipation gas flow speed is lower. However, since the gas flow speed in the second heat dissipation channel 80B is slower, as the circuit elements installed in the second heat dissipation channel 80B are more tightly arranged, they are not likely to be affected by the impurities contained in the heat dissipation flow. Therefore, in the chassis 10 of the uninterruptible power supply system of the instant disclosure, the elements generating a lot of heat and which are not likely to be damaged by the impurities are arranged in the space of the first heat dissipation channel 80A, and the circuit elements generating less heat and must be kept in a tightly arranged environment are arranged in the second heat dissipation channel 80B. Therefore, the instant disclosure can achieve the object of ensuring both the heat dissipation property and element safety.

As shown in FIG. 3, the main circuit elements of the uninterruptible power supply system of the instant disclosure comprise a controller assembly 30, a transformer assembly 40, a distribution board assembly 50 and a capacitor assembly 60. The transformer assembly 40 is the device generating most heat in the uninterruptible power supply system, the transformer assembly 40 comprises a first transformer 41 and a second transformer 42. The first transformer 41 and the second transformer 42 are the AC-DC converters of the uninterruptible power supply system, in which the first transformer 41 is disposed at the rear side of the lower space 17 and the second transformer 42 is disposed in the rear space 19 of the upper part of the chassis 10. Therefore, the first transformer 41 and the second transformer 42 of the transformer assembly 40 are both located in the space of the first heat dissipation channel 80A and can obtain better heat dissipation effect.

In addition to the first heat dissipation channel 80A and the second heat dissipation channel 80B, the chassis 10 of the instant disclosure further has another flowing channel for dissipating heat. As shown in FIG. 3, the gas flow noted by the arrow C enters a distributor box 51 of the distribution board assembly 50 through the gas-intake holes under the front side panel 21, and flows to a position underneath the front side space 18 through the opening on the upper end of the distributor box 51. The gas flow further passes through a heat dissipation module 31 at the rear side of the controller assembly 30, and is discharged from the front venting hole 161. The heat dissipation flowing channel constitutes a third heat dissipation channel 80C. The third heat dissipation channel 80C is for performing the heat dissipation of the electric components in the distribution board assembly 50.

In addition, an air baffle 171 is further disposed in the lower space 17 of the chassis 10 and surrounds the first transformer 41 of the transformer assembly 40. When the exhaust fan 163 at the top of the chassis induces the gas flow to move upward, the air baffle 171 forces the gas flow passing the lower space 17 to pass through the micro-gaps between the air baffle 171 and the outer side of the first transformer 41, or the gaps at the inner side of the first transformer 41, thereby improving the temperature-reducing efficiency of the first transformer 41.

The controller assembly 30 of the instant disclosure is disposed at the upper end of the front space 18, the distribution board assembly 50 is disposed on the front side of the lower space 17, and the capacitor assembly 60 is disposed in the front space 18 and under the controller assembly 30. Therefore, the controller assembly 30, the distribution board assembly 50 and the capacitor assembly 60 are disposed in the space of the second heat dissipation channel 80B.

As shown in FIG. 1 and FIG. 3, the distribution board assembly 50 is disposed at the front side of the lower space 17, and has a distributor box 51 with a plurality of vent holes 53 for a part of the gas flow passing the second heat dissipation channel 80B to enter the distributor box 51 of the distribution board assembly 50. The distributor box 51 accommodates the circuit elements 52 such as the breaker, the relay and the switches of the uninterruptible power supply system which are cooled by the gas flow entering the distributor box 51 from the vent hole 53.

Figure 5:
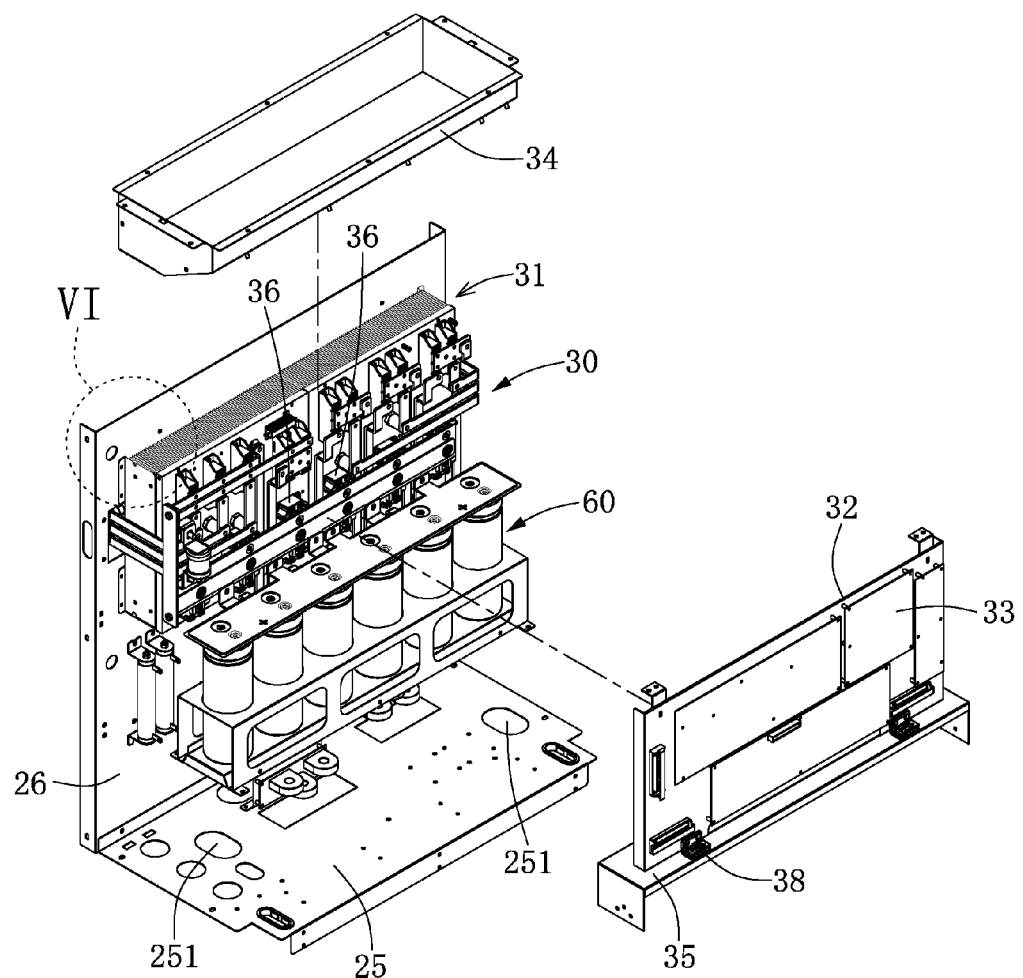
FIG. 5 is a three-dimensional partially exploded view of the controller assembly used in the instant disclosure.
Figure 6:
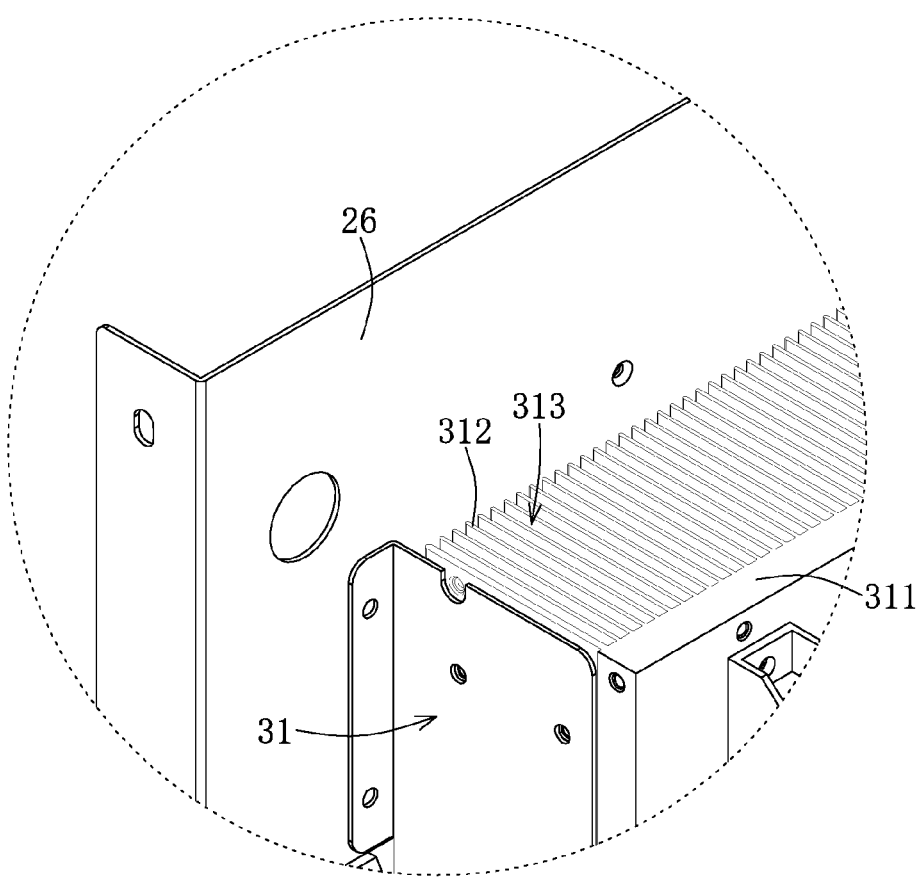
FIG. 6 is a three-dimensional enlargement partial view of the heat dissipation module used in the instant disclosure.
Figure 7:
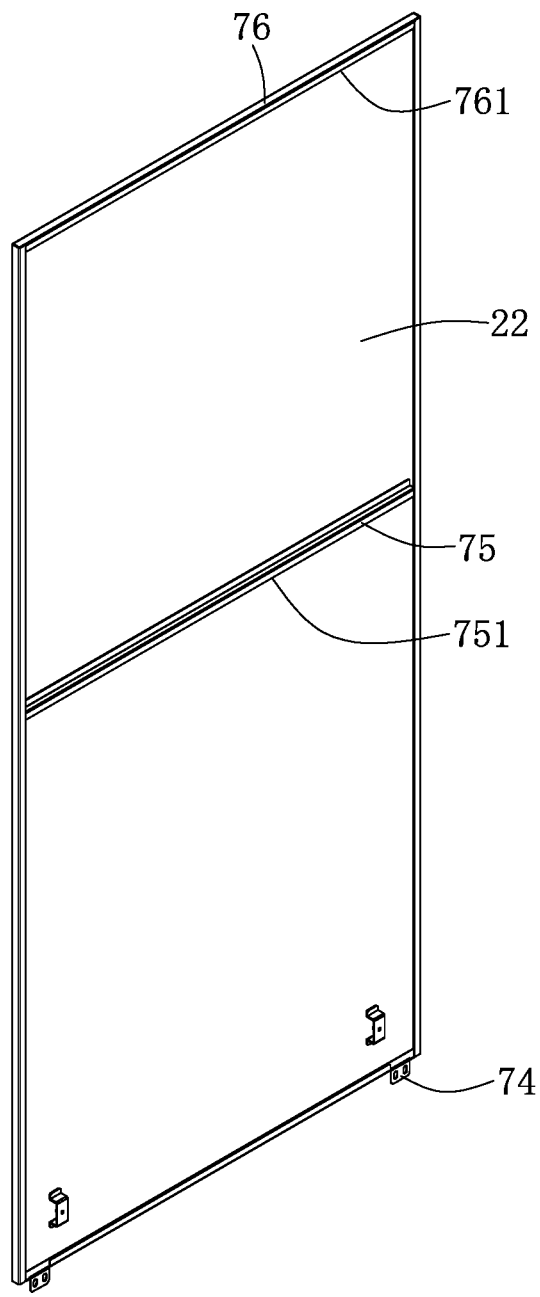
FIG. 7 is a three-dimensional view of the left side panel used in the instant disclosure observed from the rear side.

As shown in FIG. 2, FIG. 5 and FIG. 6, the controller assembly 30 is disposed in the upper portion of the front space 18, and comprises a heat dissipation module 31, disposed at a side adjacent to the central spacing plate 26, a front stopping plate 32, spaced at a distance from the heat dissipation module 31 and disposed at a side of the controller assembly 30 facing the front side surface of the chassis 10; a circuit substrate 33 disposed on a side surface of the front stopping plate 32; an air extracting cap 34 which is a hollow cap with larger upper portion, the bottom of the air extracting cap 34 connects the outer side of the top end of the heat dissipation module 31, and the top portion of the air extracting cap 34 is connected with the front venting hole 161 on the top panel 16; a plurality of power chips 36 disposed on the heat dissipation module 31; and a housing plate 35 disposed at the bottom of the front stopping plate 32 substantially perpendicular to the front stopping plate 32. The housing plate 35 partially shields the gap between the substrate 311 of the heat dissipation module 31 and the bottom of the front stopping plate 32.

Figure 5A:
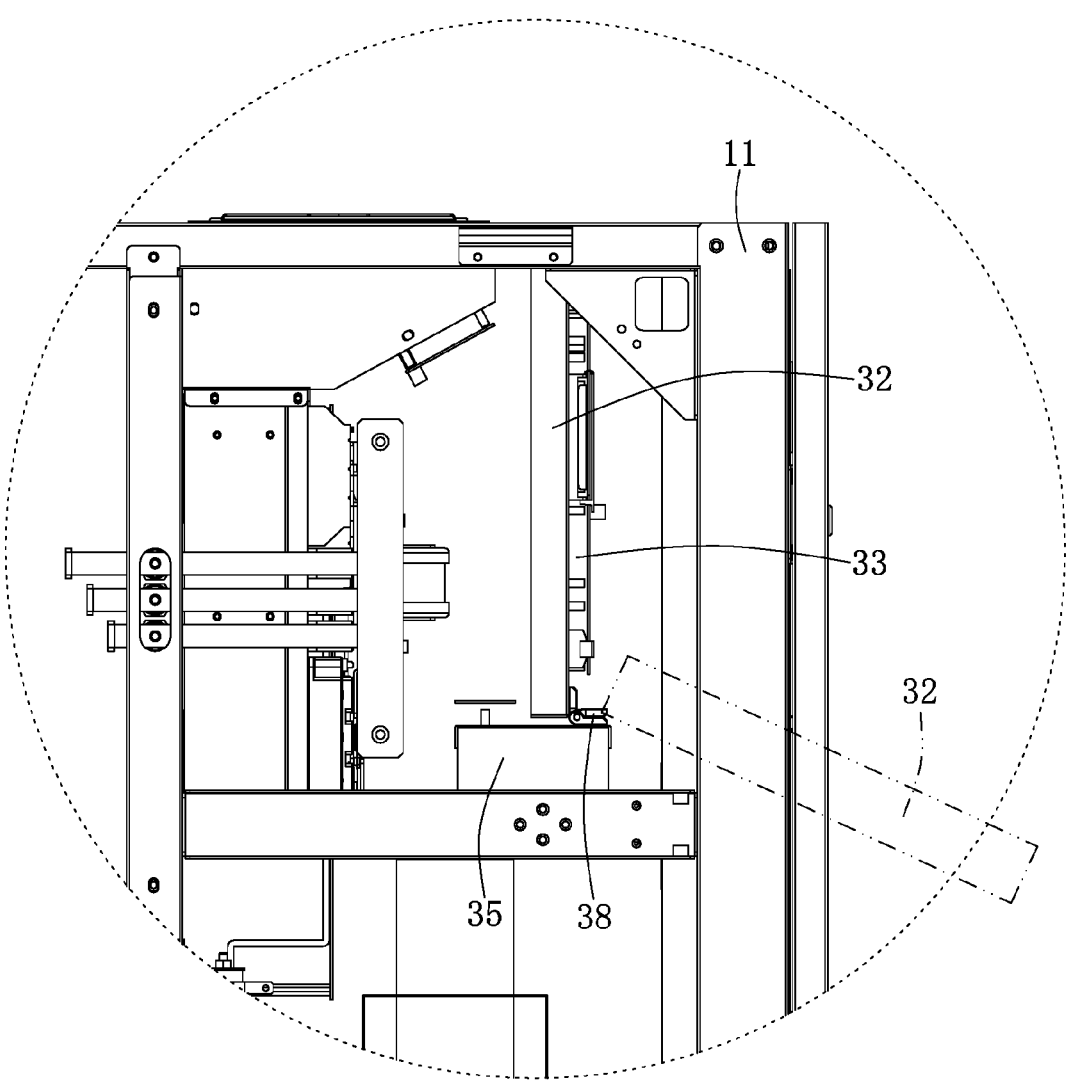
FIG. 5A is a schematic view showing the opening of the front stopping plate of the controller assembly used in the instant disclosure.

As shown in FIG. 5, the front stopping plate 32 is pivotally connected to the upper end of the housing plate 35 through two hinges 38. As shown in FIG. 5A, the front stopper plate 32 can swing toward the front side of the chassis 11 by using the hinges 38 as the pivot axis. Therefore, when the user intends to maintain or service the controller assembly 30, the front stopper plate 32 can be open and the components behind the front stopper plate 32 can be maintained. Moreover, as shown in FIG. 5A, the hinges 38 of the front stopping plate 32 can limit the opening angle of the front stopping plate 32. In this embodiment, the opening angle of the front stopping plate 32 is about 115°. Therefore, when the front stopping plate 32 is opened forwardly and the top of the front stopping plate 32 swings to a height slightly lower than the housing plate 35, the front stopping plate is limited and stops to swing.

The reason to limit the swinging angle of the front stopping plate 32 is to avoid the front stopping plate 32 from generating a swinging angle that is too large, thereby preventing the circuit substrate 33 and other electric elements disposed at the front side surface of the front stopping plate 31 from contacting the controller 30 or the chassis 11 and being damaged when the front stopping plate 32 is opened.

As shown in FIG. 6, the heat dissipation module 31 has a substrate 311 which is a plate made from metal or heat-conductive materials, the substrate 311 is parallel to the central spacing plate 26, and a plurality of heat dissipation fins 312, the plurality of heat dissipation fins 312 are metal plates and are intervally disposed on the surface of the substrate 311. The end of each heat dissipation fin 312 opposite to the substrate 311 is directly adjacent on a side surface of the central spacing plate 26. Each heat dissipation fin 312 extends from the bottom of the substrate 311 to the top of the substrate 311, and each of the heat dissipation fins 312 are parallel to each other such that the direction of each heat dissipation fin 312 is parallel to the direction of the gas flow passing the heat dissipation module 31.

As shown in FIG. 6, each two heat dissipation fins 312 has a gap therebetween and since the end of each heat dissipation fin 312 contacts the side surface of the central spacing plate 26, the openings of the gaps between the heat dissipation fins 312 are blocked by the central spacing plate 26. The heat dissipation fins 312, the substrate 311 and the central spacing plate 26 together form a plurality of gas flow channels 313.

As shown in FIG. 3 and FIG. 5, after the uninterruptible power supply system of the instant disclosure is assembled, the bottom opening of the air extracting cap 34 is connected to the upper end of the heat dissipation module 31, and the upper opening of the air extracting cap 34 engages with the bottom surface of the top panel 16 of the chassis 10 and completely covers the bottom of the front venting hole 161. Therefore, when the front exhaust fan 163 disposed in the front venting hole 161 is running, the gas in the front space 18 of the chassis 10 is discharged from the bottom of the heat dissipation module 31 through the gas flow channels 313 between the heat dissipation fins 312, the air extracting cap 34 and the front venting hole 161. The gas flow is forced to pass through the heat dissipation fins 312 and hence, the heat of the power chip 36 disposed on the heat dissipation module 31 is dissipated by the heat dissipation fins 312 of the heat dissipation module 31.

As shown in FIG. 3 and FIG. 5, in the controller assembly 30 of the instant disclosure, the inner side surface of the substrate 311 of the heat dissipation module 31, the rear side surface of the air extracting cap 34, the bottom surface of the top panel 16 of the chassis 10, the front stopping plate 32 and the housing plate 35 together form an isolation space 37. The isolating space 37 surrounds the power chip 36 and hence, is able to reduce the opportunity of the gas in the front space 18 of the chassis 10 entering the isolating space 37 and contacting with the power chip 36. The front venting hole 161 of the top panel 16 of the chassis 10 directly connects the air extracting cap 34 and the heat dissipation module 31 and hence, when the front exhaust fan 163 runs, the gas in the front space 18 of the chassis 10 is extracted from the bottom end of the heat dissipation module 31, avoiding the heat dissipation gas flow passing the isolating space 37, and reducing the opportunity of the heat dissipation gas flow in the chassis 10 to directly contact the power chip 36.

Since the power chip 36 is an important element that generates a lot of heat in the uninterruptible power supply system and is easy to be damaged by foreign matter such as dust, moisture, or insects which might cause short circuit or other errors, the above design of the controller assembly 30 of the instant disclosure surrounds the power chip 36 in the isolating space 37 and avoid the power chip 36 from contacting the heat dissipation gas flow, thereby achieving the effect of protecting the power chip 36 from malfunction. Since the controller assembly 30 comprises the power chip 36 installed on the heat dissipation module 31, the combination of the heat dissipation module 31 and the front exhaust fan 163 form a forced heat dissipation effect and the heat dissipation effect of the power chip 36 is ensured. The temperature of the operation of the power chip 36 is reduced and the stability thereof during operation is increased.

Another feature of the instant disclosure is that the components that are more likely to malfunction and need to be repaired are disposed at a side of the chassis 10 facing the front side panel 21, and the front side panel 21 is designed to be easily opened. Therefore, the maintenance personnel can perform services at the front side of the chassis 10 which is more convenient.

As shown in FIG. 1, a side edge of the front side panel 21 is a pivot end, the pivot end has a plurality of hinges 71 for pivotally connecting a side edge of the front side panel 21 on a side edge of the front side surface of the frame 11, the other side of the front side panel 21 opposite to the pivot end is an active end, the active end has a plurality of locking devices 72 and an opening handle 73 for fixing the active end of the front side panel 21 on the other side edge of the front side surface of the frame 11 opposite to the pivot end.

Figure 8:
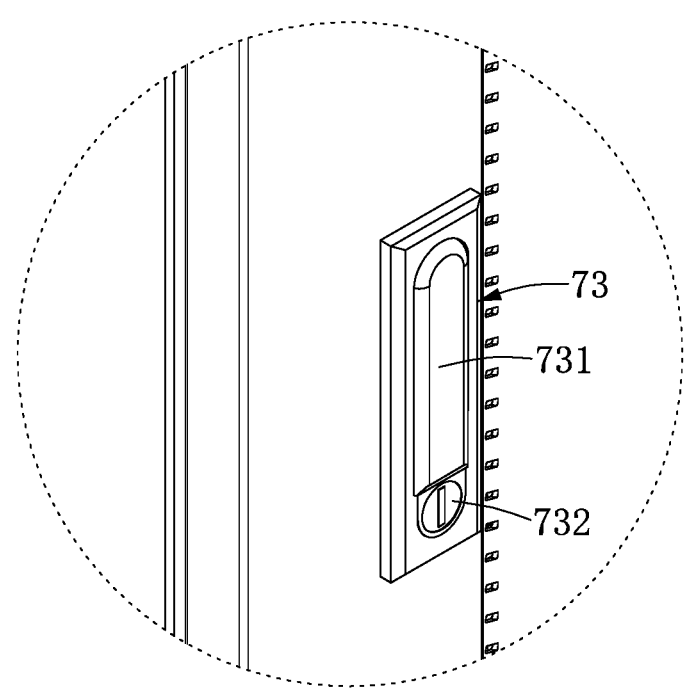
FIG. 8 is a partial three-dimensional enlargement view of the opening handle used in the instant disclosure observed from the front side.
Figure 9:
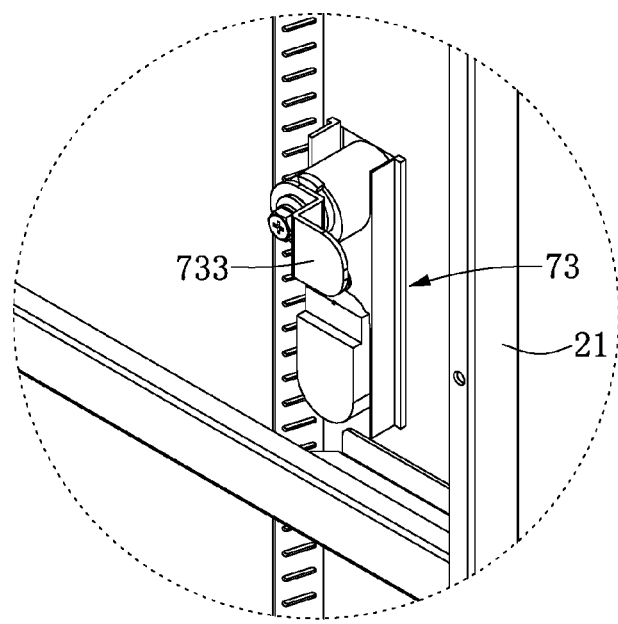
FIG. 9 is a partial three-dimensional enlargement view of the opening handle used in the instant disclosure observed from the rear side.

As shown in FIG. 8 and FIG. 9, the opening handle 73 of the front side panel 21 comprises a handle body 731 and a lock 732 attached to the handle body 731. The rotation axial of the handle body 731 passes through the rear side surface of the front side panel 21 and connects a buckle piece 733. The buckle piece 733 can fit to the edge of the frame 11 and maintain the front side panel covering the front side surface of the frame 11. The lock 732 can lock the handle body 731 for preventing the handle body 731 from rotating. When the lock 732 is unlocked by a key, the handle body 731 is able to rotate and drives the buckle piece 733 to rotate.

Figure 4:
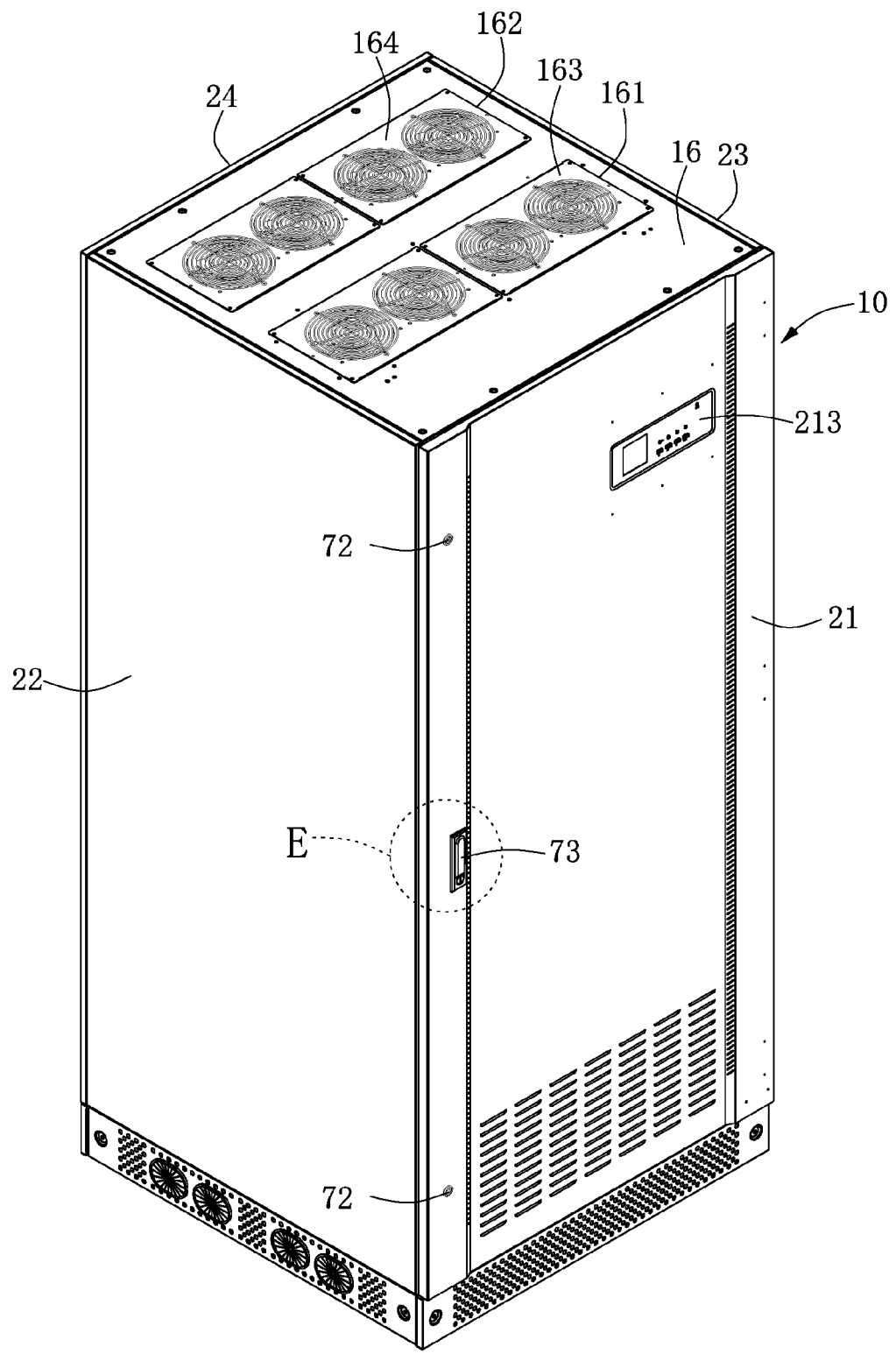
FIG. 4 is a three-dimensional assembled view of the chassis structure for industrial uninterruptable power supply system of the instant disclosure.
Figure 10:
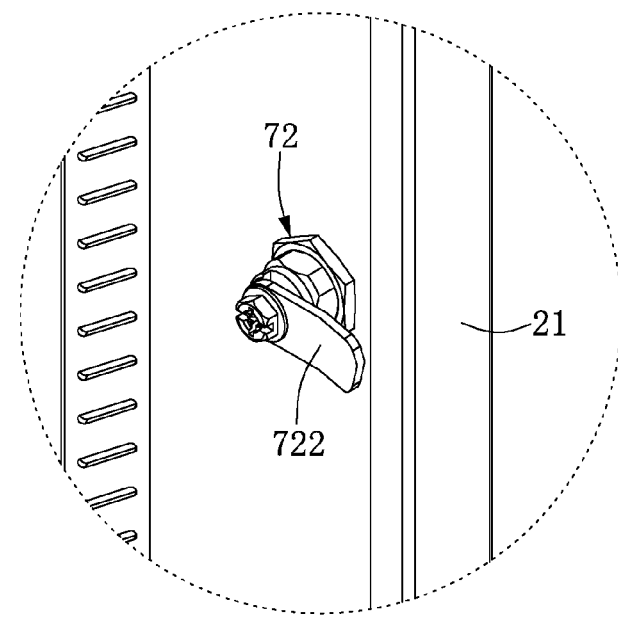
FIG. 10 is a partial three-dimensional enlargement view of the locking device used in the instant disclosure observed from the rear side.

Please refer to FIG. 1, FIG. 4 and FIG. 10. The locking devices 72 are disposed at the upper end and the lower end of the active end of the front side panel 21. As shown in FIG. 2, a position at the front side surface of the frame 11 corresponding to the two locking devices 72 has two attaching pieces 721. As shown in FIG. 10, the two locking devices 72 pass through the front side panel 21 through the front side surface to the rear side surface thereof, and the two locking devices 72 can be rotated by a key or a wrench. The end of the rotation axial of the locking device 72 has a locking piece 722. In the embodiment, the locking piece 722 can rotate to a vertical or horizontal position and when the front side panel 21 covers the front side surface of the frame 11 and the two locking pieces 722 of the two locking devices 72 are rotated to the horizontal position, the two locking pieces 722 fit into the attaching pieces 721 at the front side of the frame 11.

The front side panel 21 is fixed on the front side surface of the frame 11 through the locking device 72 and the opening handle 73 and hence, when the uninterruptible power supply system needs to be repaired, the maintenance personnel can open the opening handle 73 and the locking device 72 by a key and open the front side panel 21 for servicing. The left side panel 22, the right side panel 23 and the rear side panel 24 are disposed on the left, right and rear side respectively for forming a box with the front side panel 21. In the instant disclosure, a snap-fit member and holding member fitting with each other can be used for engaging the left side panel 22, the right side panel 23, the rear side panel 24 and the frame 11, and screws can be used for securing the above components on the side surface of the frame 11.

The structure of the locking device 72 is not limited to the structure shown in the figure and can be any other suitable locking member, or can be substituted by other types of fixing device. For example, the two locking devices 72 can be substituted by two magnetic hook devices. By utilizing the magnetic hook devices, the front side panel 21 can be fixed on the front side surface of the chassis 11 by magnetic force, thereby making the open process easier.

Figure 13:
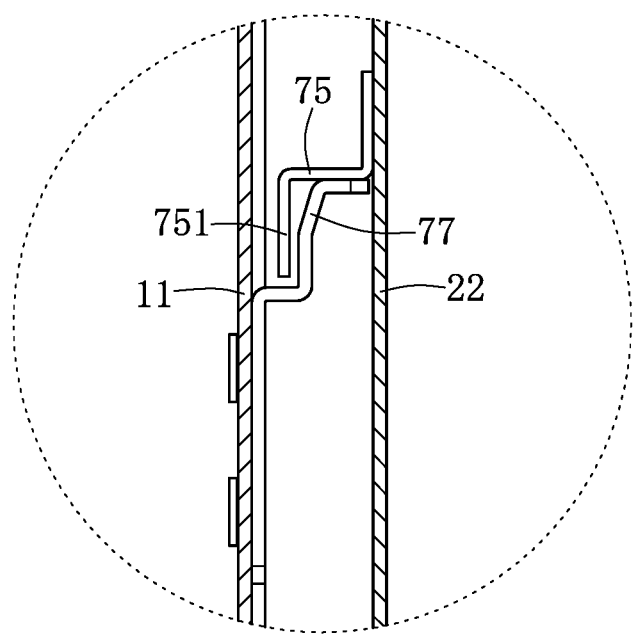
FIG. 13 is a partial enlargement sectional view of the first snap-fit piece and the first holding member used in the instant disclosure when engaging with each other.

For description convenience, the assembled structures of the left side panel 22, the right side panel 23 and the rear side panel 24 with the frame 11 are described taking the left side panel 22 as the example. As shown in FIG. 1, FIG. 2, FIG. 7 and FIG. 8, in the present embodiment, a side of the left side panel 22 adjacent to the frame 11 has a plurality of snap-fit pieces, comprising a first snap-fit piece 751 and a second snap-fit piece 761. The first snap-fit piece 751 is formed on a cross beam 75 at the inner side surface of the front side panel 21, and the cross beam 75 is a bent metal pole. As shown in FIG. 13, the section of the cross beam 75 is substantially a 'Z' form, a side edge of the cross beam 75 is soldered on the inner side surface of the left side panel 22 and the other side is bent to form a plate parallel to the surface of the left side panel 22 and face downward, thereby forming the first snap-fit piece 751. The top edge of the left side panel 22 is bent inwardly and forms a folded side 76, the end of the folded side 76 is bent downward for forming the second snap-fit piece 761.

Figure 11:
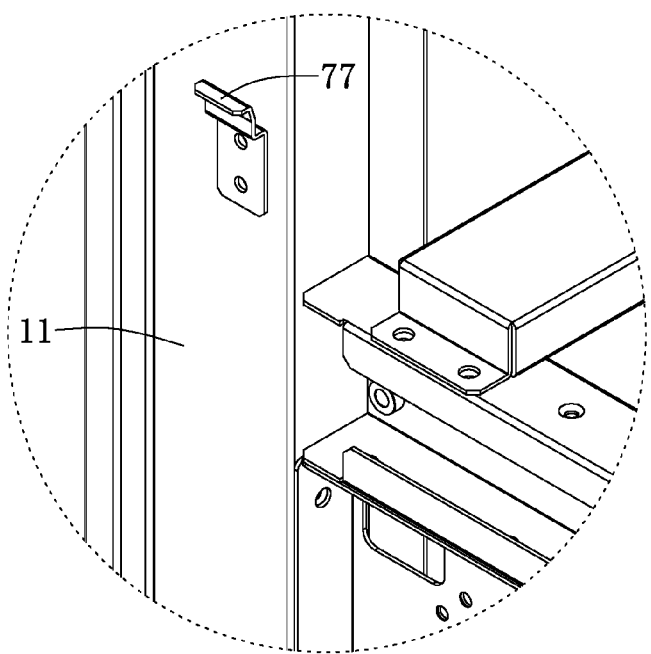
FIG. 11 is partial three-dimensional enlargement view of the first holding member fixed on the side surface of the chassis of the instant disclosure.
Figure 12:
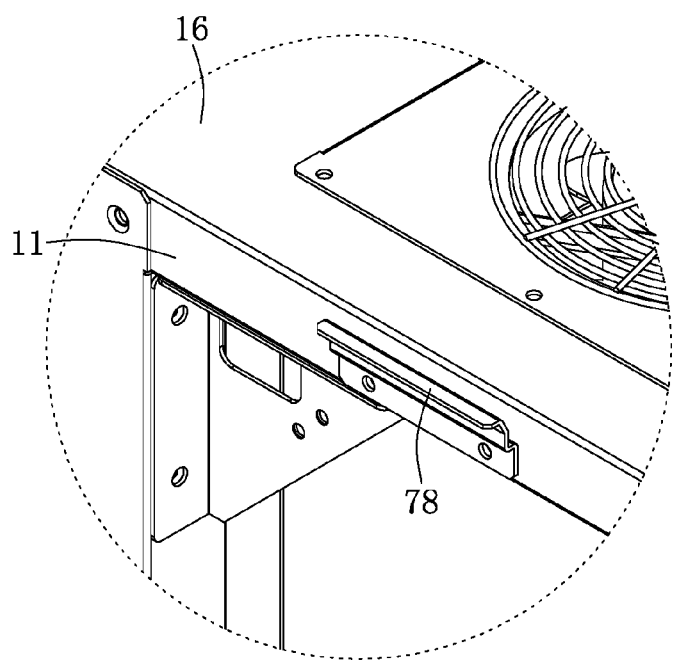
FIG. 12 is partial three-dimensional enlargement view of the second holding member fixed on the side surface of the chassis of the instant disclosure.

As shown in FIG. 1, FIG. 2, FIG. 9 and FIG. 11, the left side surface of the frame 11 has a plurality of holding members. In the present embodiment, the holding members comprise at least two first holding members 77, the positions of the two first holding members 77 correspond to the position of the first snap-fit piece 751, and at least two second holding members 78, disposed on the top end of the frame 11, the positions of the two second holding members 78 correspond to the second snap-fit piece 761. As shown in FIG. 11, taking the first holding member 77 as an example, the two first holding members 77 are formed by metal plates, an end of the metal plate is fixed on the surface of the frame 11 and the other end extends toward the top end of the frame 11 and spaces from the surface of the frame 11, thereby forming an opening facing upward. The first snap-fit piece 751 can engage into the opening of the first snap-fit piece 751. The structure of the second holding member 78 is similar to that of the first holding member 77, i.e., the second holding member 78 can engage with the second snap-fit piece 761. Therefore, the left side panel 22 can be positioned at the left side surface of the frame 11 by the first holding member 77, the second holding member 78, and the first snap-fit piece 751 and second snap-fit piece 761.

In addition, the bottom of the left side panel 22 has a plurality of fixing pieces 74 projected from the bottom edge of the left side panel 22, each fixing piece 74 has a plurality of threaded holes for a screw to pass through the fixing piece 74 and fixing each fixing piece 74 at the bottom end of the left side surface of the frame 11. Therefore, by engaging the first snap-fit piece 751 and the second snap-fit piece 761 in the first holding member 77 and the second holding member 78, and fixing the fixing piece 74 at the bottom of the left side panel 22 on the bottom of the side surface of the frame 11 by screws, the left side panel 22 can be fixed and installed at the left side surface of the frame 11.

As shown in FIG. 4, after the chassis 10 of the uninterruptible power supply system is assembled, the protective plate 15 shields the outer side of the fixing pieces 74 at the bottom of the left side panel 22 and hence, the fixing pieces 74 and the fixing screws cannot be seen from the outer surface of the chassis 10. Therefore, the object of providing an aesthetic appearance is achieved, and since the left side panel 22 cannot be removed easily, the safety of the uninterruptible power supply system is increased.

Although the figures of the instant disclosure do not show the structures of the inner side surfaces of the right side panel 23 and the rear side panel 24, the structures of the right side panel 23 and the rear side panel 24 are similar to the structure of the left side panel 22, and the assembled structure with the frame 11 thereof are similar to that of the left side panel 22 with the frame 11, i.e., the cross beam 75 and the first snap-fit piece 751 are disposed on the inner side surface of the rear side panel 24 and the right side panel 23, the second snap-fit piece 761 is disposed at the folded side 76 of the top, and the fixing piece 74 is disposed at the bottom of the rear side panel 24 and the right side panel 23. The first holding members 77 and the second holding members 78 are disposed on the left side and the rear side surface of the frame 11 respectively and hence, the right side panel 23 and the rear side panel 24 can be fixed on the right side and the rear side of the frame 11 respectively through the same process as the left side panel 22.

In addition, the left side panel 22, the right side panel 23 and the rear side panel 24 of the instant disclosure can adapt the same fixing structure as employed by the left side panel 22. Alternatively, the first snap-fit piece 751, the second snap-fit piece 761 and the fixing piece 74 can be disposed on only one of the left side panel 22, the right side panel 23 and the rear side panel 24, and the frame 11 can only have the first holding member 77 and the second holding member 78 at the side surface corresponding to the first snap-fit piece 751, the second snap-fit piece 761 and the fixing piece 74.

The chassis 10 of the instant disclosure employs the above door plate installation structure and hence, the side panels of the left and right sides and the rear side are not easy to remove after being installed. However, the front side panel 21 is able to be removed without the use of screws or wrenches. Therefore, the design of the uninterruptible power supply system and chassis structure comprises disposing the components that are easily damaged and need to be serviced on the front side space. The operator only needs to open the front side panel 21 for servicing the above components.

Effectiveness of the Embodiments

In summary, the advantage of the instant disclosure is to improve the heat dissipation performance in the chassis while maintaining the enclosure (protective) property of the chassis. In addition, by disposing the transformer assembly in the first heat dissipation channel, and disposing the controller assembly, the capacitor assembly, and the distribution board assembly in the second heat dissipation channel at the front side of the chassis, the heat dissipation efficiency of the uninterruptible power supply system is ensured, at the same time avoiding the components such as power chips that are easily damaged from directly contacting with the heat dissipation gas flow, thereby reducing the opportunity of malfunction.

In addition, since the distribution board assembly, the capacitor assembly and the controller assembly are more likely to malfunction, these components are disposed at the front side of the chassis. By utilizing the front side panel, which is easy to open, the uninterruptible power supply system of the instant disclosure can be serviced from the front side, thereby simplifying the servicing process.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A chassis structure for an industrial uninterruptible power supply system, comprising:
    a chassis having a frame and a front side panel, a left side panel, a right side panel, a rear side panel and a top panel installed on the frame, the bottom of the frame has a plurality of spacer members disposed thereon, the plurality of spacer members lifts the bottom of the frame from a ground for a distance and a gas-intake space is formed between the bottom of the frame and the ground;
    a bottom plate structure disposed between the bottom of the frame and the gas-intake space, the bottom plate structure has at least a venting plate for enabling a gas inside the gas-intake space to enter an inner space of the frame through the venting plate; and
    at least a venting hole disposed on the top panel of the frame, the venting hole has at least an exhaust fan disposed therein, the exhaust fan discharges a gas from the frame through the venting hole;
    wherein a space inside the chassis is divided into an upper space and a lower space, the upper space has a central spacing plate parallel to the front side panel and dividing the upper space into a front space and a rear space, the venting hole of the frame comprises at least a front venting hole corresponding to the front space and at least a rear venting hole corresponding to the rear space; the exhaust fan comprises at least a front exhaust fan disposed in the front venting hole, and at least a rear exhaust fan disposed in the rear venting hole;
    the front space has a controller assembly disposed therein, and the controller assembly comprises a heat dissipation module and at least a power chip, the power chip is disposed on the heat dissipation module.

2. The chassis structure according to claim 1, wherein the heat dissipation module comprises: a substrate, the power chip is installed on the substrate; and a plurality of heat dissipation fins intervally disposed on a side of the substrate opposite to the power chip, the plurality of the heat dissipation fins extends from the bottom end of the substrate to the upper end of the substrate, and an end of the substrate opposite to the plurality of heat dissipation fins is adjacently attached to a side surface of the heat dissipation module facing the central spacing plate, a gas flow generated by the exhaust fan passes through a gap between the plurality of heat dissipation fins.

3. The chassis structure according to claim 2, wherein the controller assembly further comprises:
    a front stopper plate spaced from the heat dissipation module and disposed on a side of the controller assembly facing the front end of the chassis;
    a circuit substrate disposed on a side surface of the front stopper plate;
    an air extracting cap, a bottom of the air extracting cap is connected to a top end of the heat dissipation module and a top end of the extraction cap is connected to the venting hole; and
    a housing plate disposed between a bottom of the front stopper plate and a bottom of the heat dissipation module.

4. The chassis structure according to claim 3, further comprises a transformer assembly, a distribution board assembly and a capacitor assembly; wherein the transformer assembly has a first transformer and a second transformer, the first transformer is disposed in the lower space, the second transformer is disposed in the rear space, the distribution board assembly is disposed at a front side of the lower space, and the capacitor assembly is accommodated at a position in the front space and under the controller assembly.

5. The chassis structure according to claim 4, wherein the controller assembly, the capacitor assembly, the distribution board assembly are arranged in the chassis and adjacent to the front side panel.

6. The chassis structure according to claim 5, wherein a side edge of the front side panel has a pivot end, the pivot end has a plurality of hinges pivotally connecting to a side edge of a front surface of the chassis, a side of the front side panel opposite to the pivot end has an active end, the active end has a plurality of locking devices and an opening handle, the active end is fixed on another side edge of the front side surface of the chassis opposite to the pivot end.

7. The chassis structure according to claim 6, wherein at least one of a left side surface, a right side surface and a rear side surface of the chassis has at least a holding member, each holding member has an opening portion facing upward;
a position of an inner side of at least one of the left side panel, the right side panel and the rear side panel corresponding to the plurality of holding members has at least a snap-fit piece configured to fit into the opening portions of the holding members, and the left side panel, the right side panel or the rear side panel having the snap-fit piece is fixed on the side surface of the chassis.

8. The chassis structure according to claim 7, wherein the left side panel, the right side panel or the rear side panel having the snap-fit piece has at least a locking piece projected from the bottom of the left side panel, the right side panel or the rear side panel, each locking piece has at least a threaded hole configured to accommodate a screw, the screws fix each locking piece on a bottom of the side surface of the chassis.

9. The chassis structure according to claim 8, wherein an air baffle is disposed in the lower space in the chassis, the air baffle surrounds the first transformer to force the air flow in the lower space to pass through a gap between the first transformer and the air baffle from the first transformer.

10. The chassis structure according to claim 9, wherein a plurality of protective plates are disposed around the gas-intake space, each protective plate has a plurality of gas-intake holes for flowing the air outside the protective cover into the gas-intake space through each protective plate.

11. A chassis structure for industrial uninterruptible power supply system, comprising:
a chassis having a frame and a front side panel, a left side panel, a right side panel, a rear side panel and a top panel installed on the frame;
the chassis has a transformer assembly, a controller assembly, a distribution board assembly and a capacitor assembly installed therein, wherein the controller assembly, the distribution board assembly and the capacitor assembly are arranged on a position in the chassis and adjacent to the front side panel;
wherein two sides of the front side panel have a pivot end and an active end opposite to the pivot end, the pivot end has a plurality of hinges pivotally connecting to a side edge of a front side surface of the chassis, the active end has a plurality of locking devices and an opening handle for fixing the active end on another side edge of the front side surface of the chassis opposite to the pivot end;
at least one of the left side surface, the right side surface and the rear side surface has at least a holding member, each holding member has an opening portion facing upward;
a position of an inner side of at least one of the left side panel, the right side panel and the rear side panel corresponding to the plurality of holding members has at least a snap-fit piece configured to fit into the opening portions of the holding members for fixing the left side panel, the right side panel or the rear side panel having the snap-fit piece on the side surface of the chassis;
wherein the left side panel, the right side panel or the rear side panel having the snap-fit piece has at least a locking piece projected from the bottom of the left side panel, the right side panel or the rear side panel, each locking piece has at least a threaded hole configured to accommodate a screw, the screws fix each locking piece on a bottom of the side surface of the chassis.

12. The chassis structure according to claim 11, wherein a plurality of spacer members are disposed on the bottom of the chassis, the plurality of spacer members lifts a bottom of the frame from a ground for a distance and a gas-intake space is formed between the bottom of the frame and the ground; a bottom of the chassis has a bottom plate structure having a plurality of venting plates, the air outside the chassis passes through the venting plates from the gas-intake place at the bottom of the chassis and enters the inner side of the chassis; a plurality of protective plates are disposed around the gas-intake space, each protective plate has a plurality of venting pores for allowing air flow into the gas-intake space through the protective plates.

13. The chassis structure according to claim 12, the bottom of the chassis has a plurality of protective covers, the top edges of each protective cover covers the outer sides of each locking piece.

14. The chassis structure according to claim 13, wherein an inner space of the chassis is divided into a lower space, and a front space and a rear space above the lower space, the distribution board assembly is disposed at a front end of the lower space, the controller assembly is disposed at an upper portion of the front space, and the capacitor assembly is disposed at a position in the front space and under the controller assembly.

15. The chassis structure according to claim 14, wherein the controller assembly comprises:
a heat dissipation module;
at least a power chip disposed on the heat dissipation module;
a front stopper plate spaced from the heat dissipation module and disposed on a side of the controller assembly facing a front side of the chassis;
a circuit substrate disposed on a side surface of the front stopper plate;
a housing plate disposed between a bottom of the front stopper plate and a bottom of the heat dissipation module.

16. The chassis structure according to claim 15, wherein the heat dissipation module comprises: a substrate, the power chip is installed on the substrate; and a plurality of heat dissipation fins, the plurality of heat dissipation fins is intervally disposed on a side of the substrate opposite to the power chip, the plurality of the heat dissipation fins extends from the bottom end of the substrate to the upper end of the substrate.

17. The chassis structure according to claim 16, wherein the top of the chassis has at least a venting hole, the venting hole has at least an exhaust fan, and an air extracting cap is disposed between the top of the heat dissipation module and the venting hole of the chassis.

* * * * *